US012772739B2

(12) United States Patent
Nakamura et al.

(10) Patent No.: US 12,772,739 B2
(45) Date of Patent: Oct. 20, 2026

(54) ACOUSTIC WAVE DEVICE

(71) Applicant: Murata Manufacturing Co., Ltd., Nagaokakyo (JP)

(72) Inventors: Kentaro Nakamura, Nagaokakyo (JP); Tetsuya Kimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 550 days.

(21) Appl. No.: 18/382,604

(22) Filed: Oct. 23, 2023

(65) Prior Publication Data

US 2024/0049605 A1 Feb. 8, 2024

Related U.S. Application Data

(63) Continuation of application No. PCT/JP2022/022298, filed on Jun. 1, 2022.

(30) Foreign Application Priority Data

Jun. 7, 2021 (JP) ................................ 2021-095187

(51) Int. Cl.
*H10N 30/85* (2023.01)
*H03H 9/02* (2006.01)

(52) U.S. Cl.
CPC ........ *H10N 30/85* (2023.02); *H03H 9/02133* (2013.01); *H03H 9/02228* (2013.01); *H03H 9/02566* (2013.01); *H03H 9/02818* (2013.01)

(58) Field of Classification Search
CPC ........... H03H 9/02566; H03H 9/02818; H03H 9/02228; H03H 9/02574; H03H 9/02015; H03H 9/02133; H03H 9/02897; H10N 30/85
See application file for complete search history.

(56) References Cited

U.S. PATENT DOCUMENTS

| | | | | |
|---|---|---|---|---|
| 2008/0296529 | A1 | 12/2008 | Akiyama et al. | |
| 2012/0104900 | A1 | 5/2012 | Nishihara et al. | |
| 2015/0084719 | A1 | 3/2015 | Umeda | |
| 2017/0179923 | A1 | 6/2017 | Shin et al. | |
| 2023/0370046 | A1* | 11/2023 | Kimura ............. | H03H 9/02015 |

(Continued)

FOREIGN PATENT DOCUMENTS

| | | | |
|---|---|---|---|
| JP | 2009010926 | A | 1/2009 |
| JP | 2012100029 | A | 5/2012 |

(Continued)

OTHER PUBLICATIONS

International Search Report in PCT/JP2022/022298, mailed Aug. 9, 2022, 3 pages.

(Continued)

*Primary Examiner* — J. San Martin
(74) *Attorney, Agent, or Firm* — Keating & Bennett, LLP

(57) ABSTRACT

An acoustic wave device includes a scandium-containing aluminum nitride film (ScAlN film), and an electrode on the ScAlN film. The ScAlN film includes at least one portion where a crystal orientation toward 90° from a crystal c-axis direction is rotated about 30°±5° or rotated about 15°±5°, the crystal c-axis direction being a film thickness direction of the ScAlN film or substantially a film thickness direction of the ScAlN film.

20 Claims, 6 Drawing Sheets

(56) References Cited

U.S. PATENT DOCUMENTS

| | | | | |
|---|---|---|---|---|
| 2024/0048123 | A1* | 2/2024 | Nakamura | H10N 30/853 |
| 2024/0072757 | A1* | 2/2024 | Nakamura | H03H 9/131 |
| 2025/0351730 | A1* | 11/2025 | Yanagitani | C23C 14/08 |
| 2026/0031789 | A1* | 1/2026 | Yanagitani | H03H 9/19 |

FOREIGN PATENT DOCUMENTS

| | | | |
|---|---|---|---|
| JP | 2012116736 | A | 6/2012 |
| JP | 2017112585 | A | 6/2017 |

OTHER PUBLICATIONS

Written Opinion in PCT/JP2022/022298, mailed Aug. 9, 2022, 3 pages.

* cited by examiner

ACOUSTIC WAVE DEVICE

CROSS REFERENCE TO RELATED APPLICATIONS

This application claims the benefit of priority to Japanese Patent Application No. 2021-095187 filed on Jun. 7, 2021 and is a Continuation Application of PCT Application No. PCT/JP2022/022298 filed on Jun. 1, 2022. The entire contents of each application are hereby incorporated herein by reference.

BACKGROUND OF THE INVENTION

1. Field of the Invention

The present invention relates to an acoustic wave device including a scandium-containing aluminum nitride film.

2. Description of the Related Art

Acoustic wave devices known in the related art include, as a piezoelectric film, a scandium (Sc)-containing aluminum nitride (AlN) film, that is, a ScAlN film. For example, Unexamined Patent Application Publication No. 2009-010926 discloses a BAW (Bulk Acoustic Wave) device including a scandium-doped-aluminum nitride film. In the BAW device, electrodes for applying an AC electric field are disposed on the upper surface and the lower surface of the ScAlN film. The BAW device includes a cavity below the ScAlN film. US 2015/0084719 A1 also discloses a BAW device having a similar structure.

SUMMARY OF THE INVENTION

Acoustic wave devices in the related art including a Sc-doped-aluminum nitride film increase in piezoelectricity as the Sc concentration increases. However, the ScAlN film may have warped or peeled at high Sc concentration. The warping or peeling of the ScAlN film may have degraded the characteristics of acoustic wave devices. In addition, piezoelectricity may have deteriorated.

Preferred embodiments of the present invention provide acoustic wave devices each including a scandium-containing aluminum nitride film, wherein film warping or peeling and deterioration of piezoelectricity are reduced or prevented.

An acoustic wave device according to a preferred embodiment of the present invention includes a scandium-containing aluminum nitride film, and an electrode on the scandium-containing aluminum nitride film, wherein the scandium-containing aluminum nitride film includes at least one portion where crystal orientation toward 90° from a crystal c-axis direction is rotated about 30°±5° or rotated about 15°±5°, the crystal c-axis direction being a film thickness direction of the scandium-containing aluminum nitride film or substantially a film thickness direction of the scandium-containing aluminum nitride film.

Preferred embodiments of the present invention provide acoustic wave devices that each include a scandium-containing aluminum nitride film, wherein film warping or peeling and deterioration of piezoelectricity are reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below by describing specific preferred embodiments of the present invention with reference to the drawings.

It should be understood that the preferred embodiments in this description are illustrative only, and partial replacements or combinations of configurations can be made between different preferred embodiments.

Figure 1A:
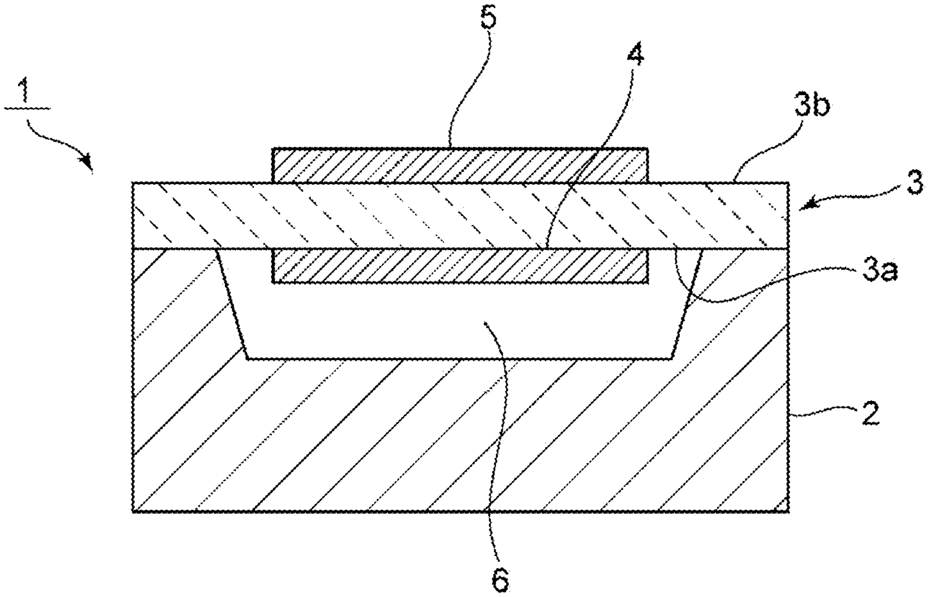
FIGS. 1A and 1B are an elevational cross-sectional view and a plan view of an acoustic wave device according to a first preferred embodiment of the present invention.
Figure 1B:
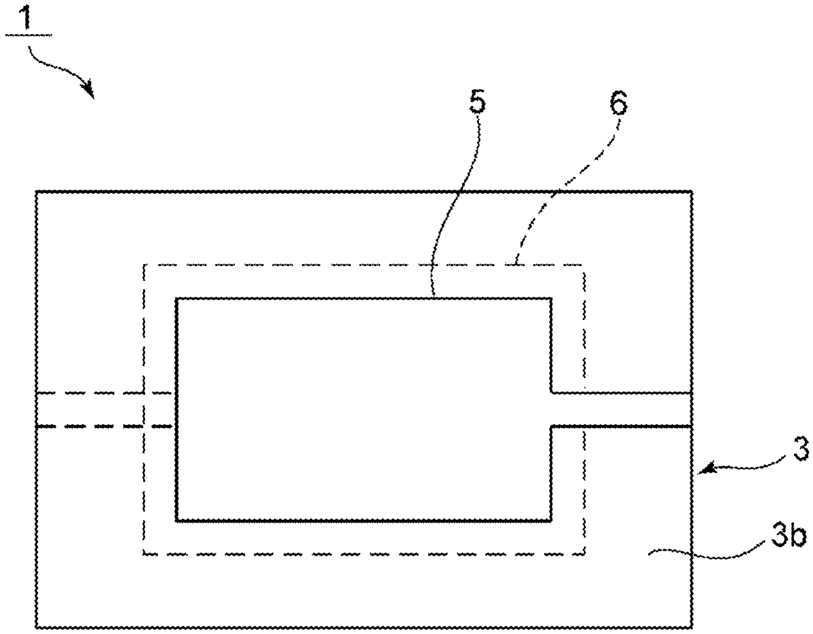

FIG. 1A is an elevational cross-sectional view of an acoustic wave device according to a first preferred embodiment of the present invention, and FIG. 1B is a plan view of the acoustic wave device.

An acoustic wave device 1 includes a support substrate 2. The support substrate 2 includes a recess on its upper surface. A scandium-containing aluminum nitride (ScAlN) film 3 is stacked so as to cover the recess on the upper surface of the support substrate 2. The ScAlN film 3 includes a first main surface 3*a* and a second main surface 3*b* opposite to the first main surface 3*a*. The first main surface 3*a* is stacked on the upper surface of the support substrate 2. This defines a cavity 6.

The acoustic wave device 1 includes first and second excitation electrodes 4 and 5 as electrodes. The first excitation electrode 4 is disposed on the first main surface 3*a*. The second excitation electrode 5 is disposed on the second main surface 3*b*. The first excitation electrode 4 and the second excitation electrode 5 overlap each other with the ScAlN film 3 interposed therebetween. This overlap region is an excitation region. Application of an AC electric field between the first excitation electrode 4 and the second excitation electrode 5 excites BAWs (Bulk Acoustic Waves), which are acoustic waves. The acoustic wave device 1 is a BAW device including the ScAlN film 3 as a piezoelectric film, wherein the acoustic waves propagating through the ScAlN film 3 are mainly BAWs.

The first excitation electrode 4 is disposed directly on the ScAlN3 film. The first excitation electrode 4 may be disposed indirectly on the ScAlN film with a dielectric film or other films interposed therebetween. The same applies to the second excitation electrode 5.

The cavity 6 is provided to prevent inhibition of BAW excitation in the ScAlN film 3. The cavity 6 is therefore positioned below the excitation electrodes.

The support substrate 2 is made of an appropriate insulator or semiconductor. Examples of such materials include silicon, glass, GaAs, ceramics, and crystal. In this preferred embodiment, the support substrate 2 is a silicon substrate with high resistance.

The first excitation electrode 4 and the second excitation electrode 5 are made of an appropriate metal or alloy. Examples of such materials include metals, such as Ti, Mo, Ru, W, Al, Pt, Ir, Cu, Cr, and Sc, and alloys containing these metals. The first and second excitation electrodes 4 and 5 may each have a multilayer body including two or more metal films.

The ScAlN film 3 can be formed by an appropriate method, such as sputtering or CVD. In this preferred embodiment, the ScAlN film 3 is deposited by using an RF magnetron sputtering apparatus.

In the sputtering, a first target made of Al and a second target made of Sc are used to perform sputtering in a nitrogen gas atmosphere. In other words, the ScAlN film is formed by binary sputtering. In this case, the degree of orientation of the ScAlN film can be controlled by adjusting the sputtering conditions. The sputtering conditions may be, for example, the RF power magnitude, the gas pressure, the gas flow rate, and the target material composition or purity.

The orientation of the deposited ScAlN film can be determined by using ASTAR (registered trademark). ASTAR uses the ACOM-TEM method (Automated Crystal Orientation Mapping-TEM method)

Figure 2:
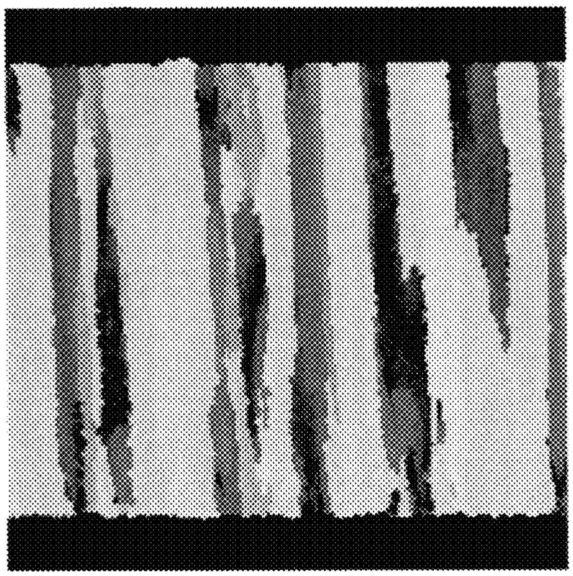
FIG. 2 is a micrograph of an inverse pole figure map showing the crystal orientation distribution in the scandium-containing aluminum nitride film in the acoustic wave device according to the first preferred embodiment of the present invention.
Figure 3:
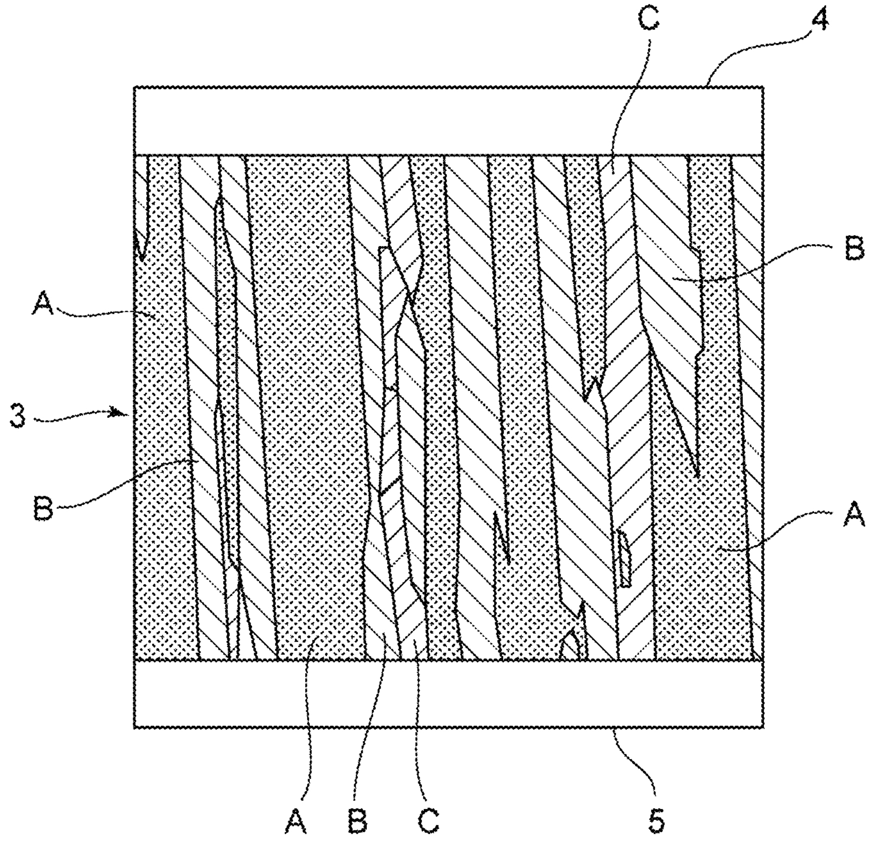
FIG. 3 is a schematic elevational cross-sectional view for describing portions having crystal orientations rotated about 30° and 15° in the cross section in the film thickness direction in the inverse pole figure map shown in FIG. 2.

FIG. 2 is a micrograph of an inverse pole figure map showing the crystal orientation distribution in the ScAlN film measured by using ASTAR described above. FIG. 3 is a schematic elevational cross-sectional view of the inverse pole figure map shown in FIG. 2. FIG. 3 illustrates portions having crystal orientations rotated approximately 30° and 15° in the cross section in the film thickness direction in the inverse pole figure map shown in FIG. 2. More specifically, in FIG. 3, regions A and regions B have crystal orientations having an approximately 30° rotation relationship in the cross section in the c-axis direction, that is, the film thickness direction. Regions B and regions C have crystal orientations having an approximately 15° rotation relationship in the cross section in the film thickness direction. In addition, the regions A and the regions C have crystal orientations having an approximately 15° rotation relationship in the cross section in the film thickness direction. The rotation in the cross section in the film thickness direction means that the orientation is distributed in the direction perpendicular to the film thickness direction, that is, in the horizontal direction when the film thickness direction is regarded as the vertical direction. In other words, the "orientation" refers to orientation toward 90° from the c-axis direction in ScAlN that is c-axis-oriented in a film thickness direction or substantially a film thickness direction. In other words, the "orientation" refers to orientation in the horizontal direction when the c-axis direction is regarded as the vertical direction.

The phrase "substantially a film thickness direction" includes not only the film thickness direction but also directions that are oblique to the film thickness direction but close to the film thickness direction. In this description, the film thickness direction may also be referred to as the thickness direction.

Referring to FIG. 3, the crystal grains in the ScAlN film 3 are grown in a columnar shape in a direction oblique to the film thickness direction. The ScAlN film 3 includes portions having the approximately 300 rotation relationship or the approximately 15° rotation relationship.

Figure 4:
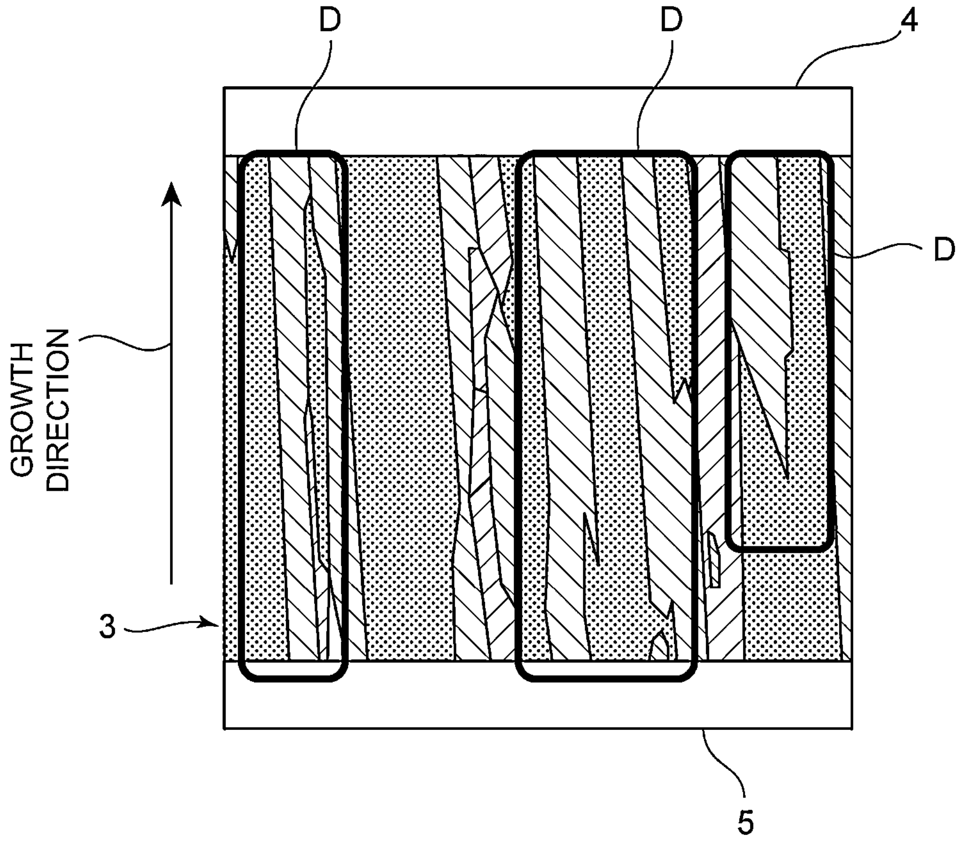
FIG. 4 is a schematic elevational cross-sectional view showing areas where crystal orientations in adjacent portions have an approximate 30° rotation relationship in the cross section in the thickness direction in the schematic elevational cross-sectional view shown in FIG. 3.

FIG. 4 shows areas where adjacent regions have the approximately 30° rotation relationship in the schematic elevational cross-sectional view in FIG. 3. In FIG. 4, the areas enclosed by the frames D correspond to the approximately 30° rotation relationship.

Figure 5:
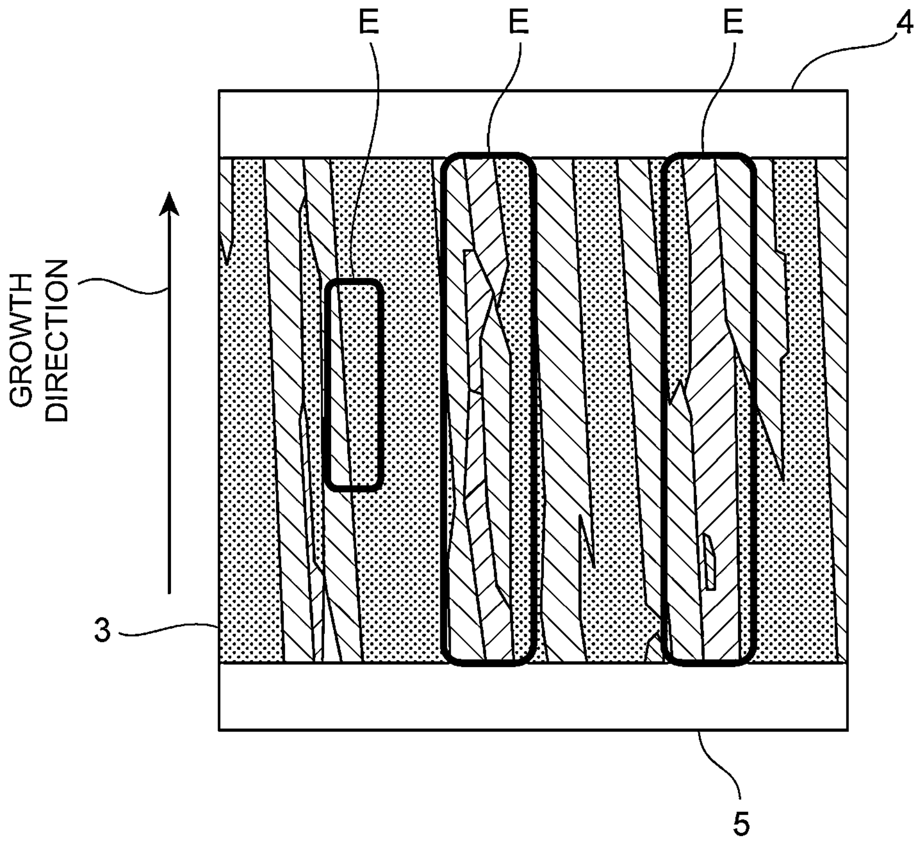
FIG. 5 is a schematic elevational cross-sectional view showing areas where crystal orientations in adjacent portions have an approximate 15° rotation relationship in the cross section in the thickness direction in the schematic elevational cross-sectional view shown in FIG. 3.

FIG. 5 shows areas where adjacent regions have the approximately 15° rotation relationship in the schematic elevational cross-sectional view in FIG. 3. In FIG. 5, the areas enclosed by the frames E correspond to the approximately 15° rotation relationship.

Figure 6:
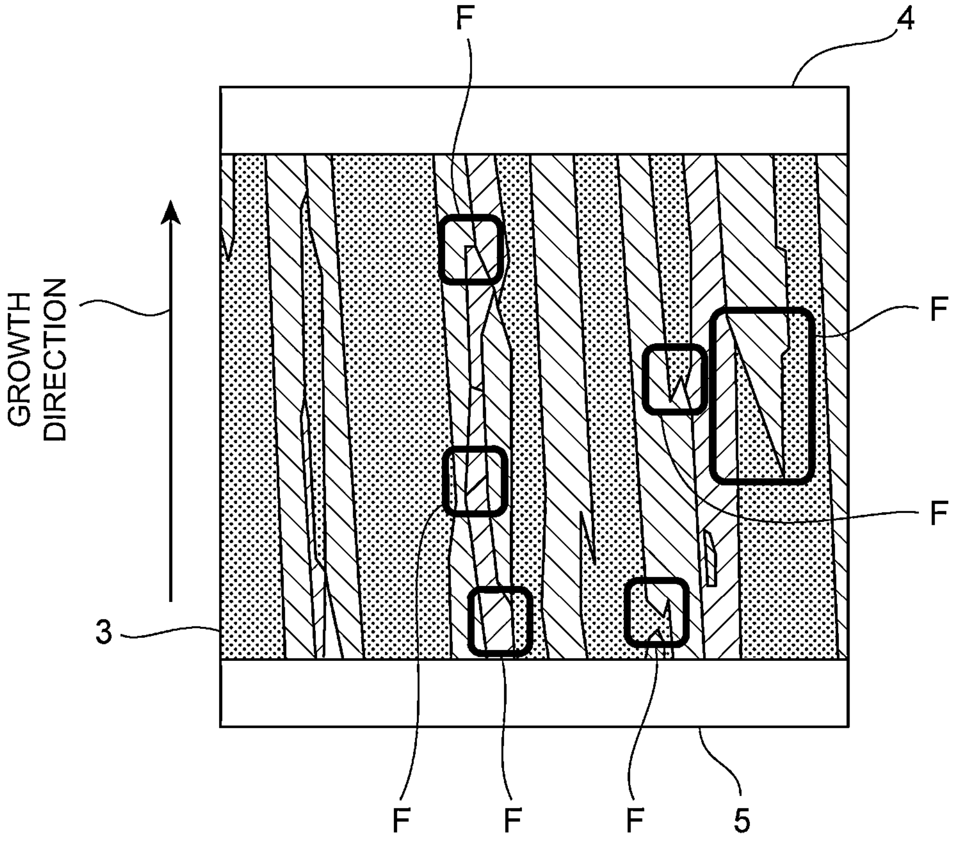
FIG. 6 is a schematic elevational cross-sectional view for describing areas where the crystal is grown in the approximately 30° rotation direction or the approximately 15° rotation direction during the crystal growth process in the schematic elevational cross-sectional view shown in FIG. 3.

FIG. 6 shows portions where crystal grains are grown in the approximately 30° rotation direction or the approximately 15° rotation direction in FIG. 3. The areas enclosed by the frames F in FIG. 6 indicate areas where crystal grains are grown in the approximately 30° rotation direction or the approximately 15° rotation direction. The arrows in FIGS. 4 to 6 indicate the crystal growth direction.

The orientation distribution in the ScAlN film as described above is achieved by adjusting the conditions in the deposition process as described above, for example, by adjusting the flow rate and composition of the sputtering gas, and the sputtering temperature and time, and other conditions.

The acoustic wave device 1 is characteristic in that the ScAlN film 3 is less likely to warp or peel since the ScAlN film has the crystal orientation described above. In addition, piezoelectricity is less likely to deteriorate. In the related art, the ScAlN film has been deposited such that the orientation toward 90° from the c-axis direction becomes unidirectional. In this case, there is an issue that the film undergoes high stress to cause warping or peeling.

According to a preferred embodiment of the present invention, the crystal growth process generates portions where the crystal orientation toward 90° from the crystal c-axis direction (the film thickness direction or substantially the film thickness direction) is rotated about 30° or about 15°. This reduces the stress so that warping or peeling is reduced or prevented. In addition, piezoelectricity is less likely to deteriorate. The rotation angle of the orientation direction may have a difference of about ±5°, for example. The ScAlN film 3 includes at least one portion where the crystal orientation toward 90° from the crystal c-axis direction is rotated about 30°±5° or rotated about 15°±5°, for example. The ScAlN film 3 may include at least one portion adjacent to the portion that is rotated about 30°±5° or about 15°±5°.

Furthermore, the ScAlN film is highly oriented in the c-axis direction. Since high orientation can be maintained, good acoustic characteristics are obtained. Therefore, for example, a filter including the acoustic wave device 1 enables lower loss.

The concentration of scandium contained in the ScAlN film is preferably about 2 atom % or more and about 20 atom % or less, for example. When the concentration of scandium is about 2 atom % or more, for example, the orientation distribution as described above can be achieved more assuredly. If the concentration of scandium is more than about 20 atom %, for example, the stress in the film is so large that it is difficult to prevent or reduce warping or peeling.

Figure 7:
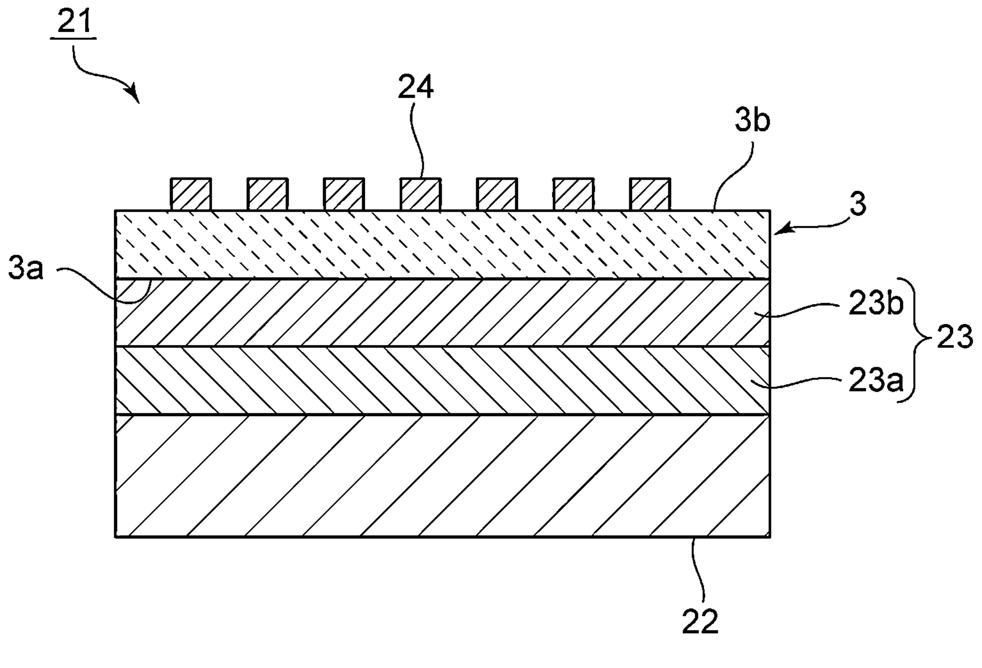
FIG. 7 is an elevational cross-sectional view of an acoustic wave device according to a second preferred embodiment of the present invention.

FIG. 7 is an elevational cross-sectional view of an acoustic wave device according to a second preferred embodiment of the present invention. In an acoustic wave device 21, a ScAlN film 3 is stacked on a support substrate 22 with an intermediate layer 23 interposed therebetween. In the intermediate layer 23, a second dielectric layer 23*b* is stacked on a first dielectric layer 23*a*. In this preferred embodiment, the first dielectric layer 23*a* is made of silicon nitride. The second dielectric layer 23*b* is made of silicon oxide. An IDT electrode 24 is disposed as an electrode on the ScAlN film 3. The acoustic wave device 21 of this preferred embodiment is a surface acoustic wave device having the IDT electrode 24. As described above, the electrode in contact with the ScAlN film 3 may be the IDT electrode 24 in the present invention. Surface acoustic waves propagating through the ScAlN film 3 may be used by applying an AC voltage from the IDT electrode 24. Like the first and second excitation electrodes 4 and 5, the IDT electrode 24 may be disposed indirectly on the ScAlN film 3 with a dielectric film or other films interposed therebetween.

The IDT electrode 24 may be made of the same material as the upper electrode 5 and the lower electrode 4 as described above.

The first dielectric layer 23*a* and the second dielectric layer 23*b* of the intermediate layer 23 may be made of various dielectric materials, such as alumina and silicon oxynitride as well as silicon nitride and silicon oxide.

The support substrate 22 may be made of the same material as the support substrate 2 in the first preferred embodiment.

In the acoustic wave device 21, the ScAlN film 3 also has the same crystal orientation as in the first preferred embodiment. In the acoustic wave device 21, film warping or peeling can be prevented or reduced, and piezoelectricity is less likely to deteriorate.

By the way, the first dielectric layer 23*a* in this preferred embodiment is a high acoustic velocity film defining and functioning as a high acoustic velocity material layer. The high acoustic velocity material layer is a relatively high acoustic velocity layer. More specifically, the acoustic velocity of a bulk wave propagating through the high acoustic velocity material layer is higher than the acoustic velocity of an acoustic wave propagating through the ScAlN film 3. The second dielectric layer 23*b* is a low acoustic velocity film. The low acoustic velocity film is a relatively low acoustic velocity film. More specifically, the acoustic velocity of a bulk wave propagating through the low acoustic velocity film is lower than the acoustic velocity of a bulk wave propagating through the ScAlN film 3. When the high acoustic velocity film defining and functioning as a high acoustic velocity material layer, the low acoustic velocity film, and the ScAlN film 3 are stacked in this order, the acoustic wave energy can be effectively confined on the ScAlN film 3 side.

The intermediate layer may be a low acoustic velocity film. In this case, the support substrate 22 is preferably a high acoustic velocity support substrate defining and functioning as a high acoustic velocity material layer. When the high acoustic velocity support substrate defining and functioning as a high acoustic velocity material layer, the low acoustic velocity film, and the ScAlN film 3 are stacked in this order, the acoustic wave energy can be effectively confined on the ScAlN film 3 side.

The intermediate layer may be a high acoustic velocity film. When the high acoustic velocity film defining and functioning as a high acoustic velocity material layer, and the ScAlN film 3 are stacked, the acoustic wave energy can be effectively confined on the ScAlN film 3 side.

In the absence of the intermediate layer, the support substrate 22 is preferably a high acoustic velocity support substrate. When the high acoustic velocity support substrate and the ScAlN film 3 are stacked, the acoustic wave energy can be effectively confined on the ScAlN film 3 side.

Examples of the material of the high acoustic velocity material layer include various materials, such as aluminum oxide, silicon carbide, silicon nitride, silicon oxynitride, silicon, sapphire, lithium tantalate, lithium niobate, crystal, alumina, zirconia, cordierite, mullite, steatite, forsterite, magnesia, a DLC (diamond-like carbon) film, and diamond; a medium including the above material as a main component; and a medium including a mixture of the above materials as a main component.

Examples of the material of the low acoustic velocity film include various materials, such as silicon oxide, glass, silicon oxynitride, tantalum oxide, and a compound formed by adding fluorine, carbon, boron, hydrogen, or a silanol group to silicon oxide, and a medium including the above material as a main component.

Figure 8:
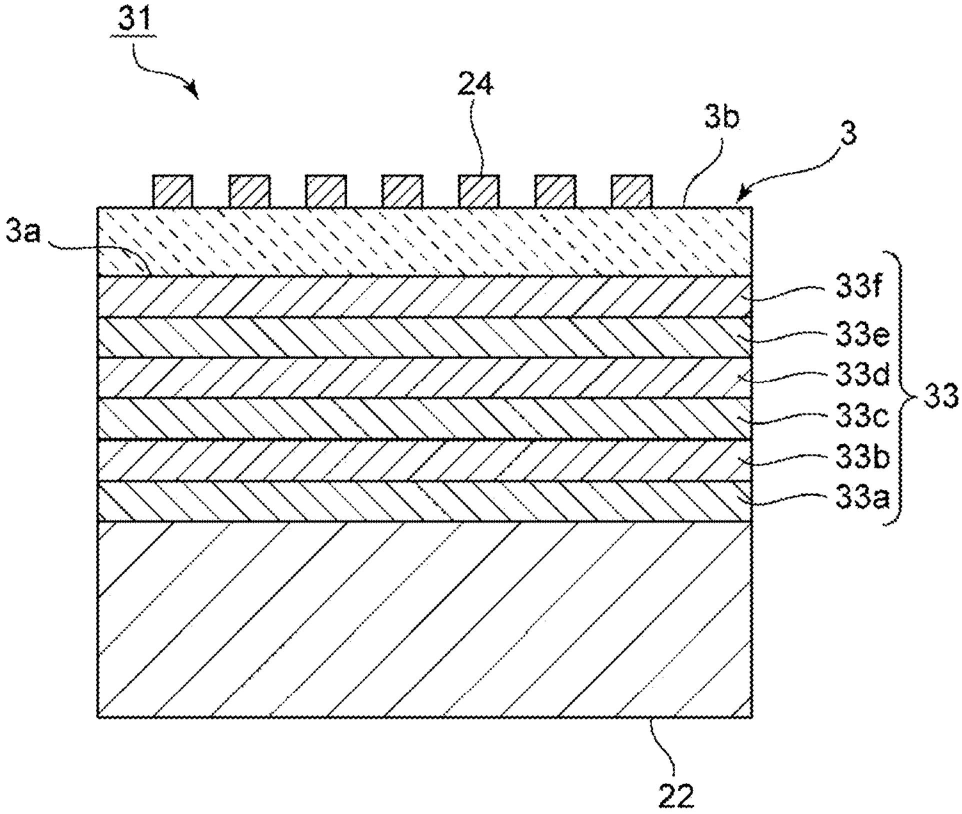
FIG. 8 is an elevational cross-sectional view of an acoustic wave device according to a third preferred embodiment of the present invention.

FIG. 8 is an elevational cross-sectional view of an acoustic wave device according to a third preferred embodiment of the present invention.

In an acoustic wave device 31, an intermediate layer 33 includes acoustic reflection layers. Specifically, the intermediate layer 33 includes a multilayer body including high acoustic impedance layers 33*a*, 33*c*, and 33*e* having a relatively high acoustic impedance, and low acoustic impedance layers 33*b*, 33*d*, and 33*f* having a relatively low acoustic impedance. The acoustic wave device 31 has the same structure as the acoustic wave device 21 except that the intermediate layer 33 has the above structure.

In a preferred embodiment of the present invention, the intermediate layer may include these acoustic reflection layers. In the acoustic wave device 31, the ScAlN film 3 also has the same crystal orientation as in the first preferred embodiment. Therefore, film warping or peeling and deterioration of piezoelectricity are reduced or prevented.

Examples of the material of the high acoustic impedance layers 33*a*, 33*c*, and 33*e* include metals, such as platinum and tungsten, and dielectrics, such as aluminum nitride and silicon nitride. Examples of the material of the low acoustic impedance layers 33*b*, 33*d*, and 33*f* include silicon oxide and aluminum.

Figure 9:
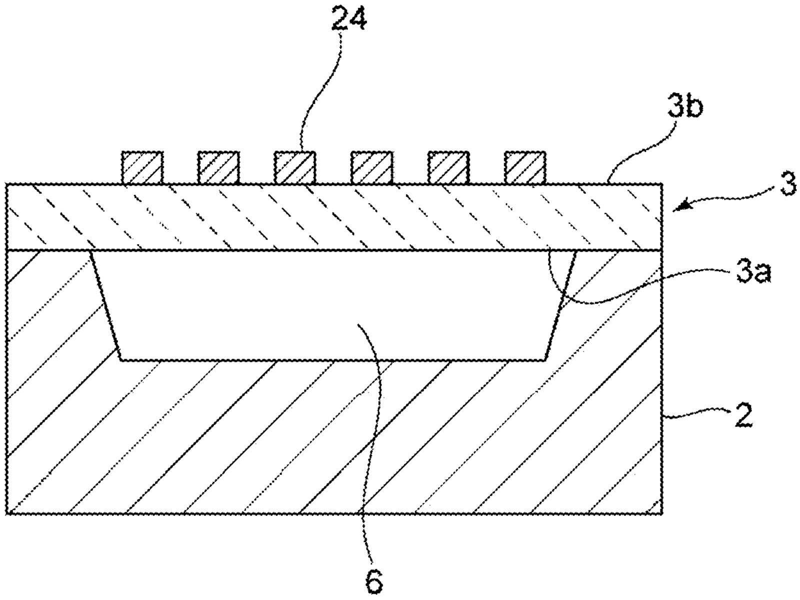
FIG. 9 is an elevational cross-sectional view of an acoustic wave device according to a fourth preferred embodiment of the present invention.

FIG. 9 is an elevational cross-sectional view of an acoustic wave device according to a fourth preferred embodiment of the present invention.

This preferred embodiment differs from the first preferred embodiment in that the electrode on the ScAlN film 3 is the IDT electrode 24. The IDT electrode 24 is disposed on the second main surface 3*b* of the ScAlN film 3. Otherwise, the acoustic wave device of this preferred embodiment has the same structure as the acoustic wave device 1 of the first preferred embodiment.

In plan view, at least a portion of the IDT electrode 24 overlaps the cavity 6. The plan view refers to a view from above in FIG. 9.

The acoustic wave device according to this preferred embodiment is a surface acoustic wave device including the ScAlN film 3 as a piezoelectric film, wherein the acoustic waves propagating through the ScAlN film 3 are mainly plate waves. In this preferred embodiment, the ScAlN film 3 also has the same crystal orientation as in the first preferred embodiment. Therefore, film warping or peeling and deterioration of piezoelectricity is reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a scandium-containing aluminum nitride film; and an electrode on the scandium-containing aluminum nitride film; wherein the scandium-containing aluminum nitride film includes at least one portion where a crystal orientation toward 90° from a crystal c-axis direction is rotated about 30°±5° or rotated about 15°±5°, the crystal c-axis direction being a film thickness direction of the scandium-containing aluminum nitride film or substantially a film thickness direction of the scandium-containing aluminum nitride film.

2. The acoustic wave device according to claim 1, wherein the scandium-containing aluminum nitride film includes at least one portion adjacent to the at least one portion that is rotated about 30°±5° or rotated about 15°±5°.

3. The acoustic wave device according to claim 1, wherein a crystal growth direction in the scandium-containing aluminum nitride film is an oblique direction that is oblique to a film thickness direction of the scandium-containing aluminum nitride film, and a crystal is grown in a columnar shape in the oblique direction.

4. The acoustic wave device according to claim 1, wherein the electrode includes a first excitation electrode on a first main surface of the scandium-containing aluminum nitride film and a second excitation electrode on a second main surface of the scandium-containing aluminum nitride film.

5. The acoustic wave device according to claim 4, wherein the first excitation electrode and the second excitation electrode are structured to generate a bulk acoustic wave.

6. The acoustic wave device according to claim 1, wherein the electrode is an IDT electrode.

7. The acoustic wave device according to claim 4, further comprising:

a support substrate on a first main surface side of the scandium-containing aluminum nitride film; wherein a cavity is between the support substrate and the scandium-containing aluminum nitride film.

8. The acoustic wave device according to claim 4, further comprising:

a support substrate on a first main surface side of the scandium-containing aluminum nitride film; and an intermediate layer between the support substrate and the first main surface of the scandium-containing aluminum nitride film.

9. The acoustic wave device according to claim 8, wherein the intermediate layer is an acoustic reflection layer.

10. The acoustic wave device according to claim 9, wherein the acoustic reflection layer includes a high acoustic impedance layer having a relatively high acoustic impedance and a low acoustic impedance layer having a relatively low acoustic impedance.

11. The acoustic wave device according to claim 6, further comprising:

a high acoustic velocity material layer on a first main surface side of the scandium-containing aluminum nitride film; wherein an acoustic velocity of a bulk wave propagating through the high acoustic velocity material layer is higher than an acoustic velocity of an acoustic wave propagating through the scandium-containing aluminum nitride film.

12. The acoustic wave device according to claim 11, further comprising:

a low acoustic velocity film between the scandium-containing aluminum nitride film and the high acoustic velocity material layer; wherein an acoustic velocity of a bulk wave propagating through the low acoustic velocity film is lower than an acoustic velocity of a bulk wave propagating through the scandium-containing aluminum nitride film.

13. The acoustic wave device according to claim 1, wherein the electrode includes a first excitation electrode disposed directly on a first main surface of the scandium-containing aluminum nitride film and a second excitation electrode disposed directly on a second main surface of the scandium-containing aluminum nitride film.

14. The acoustic wave device according to claim 1, wherein the electrode includes a first excitation electrode disposed indirectly on a first main surface of the scandium-containing aluminum nitride film and a second excitation electrode disposed indirectly on a second main surface of the scandium-containing aluminum nitride film.

15. The acoustic wave device according to claim 14, wherein at least one first film is interposed between the first excitation electrode and the first main surface of the scandium-containing aluminum nitride film, and at least one second film is interposed between the second excitation electrode and the second main surface of the scandium-containing aluminum nitride film.

16. The acoustic wave device according to claim 7, wherein the support substrate is made of an insulator or a semiconductor.

17. The acoustic wave device according to claim 8, wherein the support substrate is made of an insulator or a semiconductor.

18. The acoustic wave device according to claim 1, wherein a concentration of scandium in the scandium-containing aluminum nitride film is about 2 atom % or more and about 20 atom % or less.

19. The acoustic wave device according to claim 8, wherein the intermediate layer includes first and second dielectric layers.

20. The acoustic wave device according to claim 8, wherein the intermediate layer is a high acoustic velocity film.

* * * * *